US006607071B1

United States Patent
An et al.

(10) Patent No.: US 6,607,071 B1
(45) Date of Patent: Aug. 19, 2003

(54) SEALED TEST CHAMBER FOR MODULE IC HANDLER

(75) Inventors: Tae Sung An, Jeunbuk (KR); Chan Ho Park, Choongnam (KR); Yong Soo Moon, Choongbuk (KR); Eun Hyoung Seong, Seoul (KR); Ku Kyong Kim, Seoul (KR)

(73) Assignee: Mirae Corporation, Ichon (KR)

( * ) Notice: Subject to any disclaimer, the term of this patent is extended or adjusted under 35 U.S.C. 154(b) by 0 days.

(21) Appl. No.: 09/417,841

(22) Filed: Oct. 14, 1999

(30) Foreign Application Priority Data

Oct. 19, 1998 (KR) .................................................. 43685
Oct. 19, 1998 (KR) .................................................. 43686

(51) Int. Cl.$^7$ ............................................. B65G 25/00
(52) U.S. Cl. ................................................. 198/774.2
(58) Field of Search .......................... 198/774.2, 774.1, 198/751, 776, 750.14; 324/158.1

(56) References Cited

U.S. PATENT DOCUMENTS

| 3,308,977 A | * | 3/1967 | Cochran et al. ............. 414/404 |
| 3,322,259 A | * | 5/1967 | Milazzo ....................... 198/751 |
| 3,590,987 A | * | 7/1971 | Evans .......................... 198/751 |
| 3,823,461 A | * | 7/1974 | Squires et al. ............ 198/774.2 |
| 4,407,406 A | * | 10/1983 | Norris ....................... 198/774.1 |
| 4,588,342 A | * | 5/1986 | Hirokawa et al. ........ 414/797.4 |
| 4,687,092 A | * | 8/1987 | Ray .......................... 198/774.1 |
| 4,715,501 A | * | 12/1987 | Sato ............................ 209/573 |
| 5,203,445 A | * | 4/1993 | Shiraiwa ..................... 198/751 |
| 5,291,986 A | * | 3/1994 | Wheaton ................. 198/486.6 |
| 5,454,466 A | * | 10/1995 | Galarowic ................... 198/751 |
| 5,675,247 A | * | 10/1997 | Miller et al. ............. 324/158.1 |
| 5,742,158 A | * | 4/1998 | Itoh ......................... 324/158.1 |
| 5,788,084 A | * | 8/1998 | Onishi et al. ............ 324/158.1 |

* cited by examiner

*Primary Examiner*—Neil Abrams
(74) *Attorney, Agent, or Firm*—Fleshner & Kim, LLP

(57) ABSTRACT

The present invention relates to an improved chamber for a module IC handler including a pre-heater for heating module ICs to a set temperature. A receiving piece is installed in a heating chamber and is formed with a plurality of receiving grooves for receiving a carrier holding module ICs. An operating piece is disposed the chamber adjacent the receiving piece. An upper surface the operating piece includes a plurality of receiving grooves of the same interval as the receiving grooves of the receiving piece. In operation, the operating piece raises a module IC carrier from a first groove on the receiving piece and translates the module IC carrier by a distance roughly equivalent to the thickness of the module IC carrier. After translating the module IC carrier, the operating piece lowers the module IC carrier into an adjacent second groove on the receiving piece. By repeating this cycle, the operating piece moves a module IC carrier down the receiving piece, a groove at a time, while the module ICs are being heated, to a feeding means. The feeding means moves the module IC carrier to a test site. Shutters prevent heat from escaping the chamber while the module IC carriers move through the chamber.

21 Claims, 13 Drawing Sheets

SEALED TEST CHAMBER FOR MODULE IC HANDLER

BACKGROUND OF THE INVENTION

1. Field of the Invention

The present invention relates to a module IC handler, and, more particularly to an improved chamber for a module IC handler including a pre-heater for appropriately heating at a set temperature while a carrier served with a plurality of module ICs is moved, and a test site for enabling an outside tester to test by being pushed the carrier by a pusher.

2. Background of the Related Art

In general, as shown in FIG. 1, a module IC is an independent circuit by soldering for a plurality of ICs and components 3 to one side or both sides of a substrate 2, and is mounted on a main board. The module IC serves to increase a capacity. In FIG. 1, unexplained number 3a denotes a pattern.

The conventional module IC manufacturing process have problems as follows.

An equipment, in which the module IC 1 is automatically loaded in a test socket to be tested and is automatically distributed it according to the result of the test so that the module IC 1 is not loaded to a customer tray not shown, should have been developed. However, because the equipment like that has not been developed, an operator should extract the module IC from the tray one by one for loading into the test socket and performs the test during a predetermined time. After the test, the module IC is distributed to receive the customer tray according to the result of the test thereby causing a working efficiency to be deteriorated.

Meanwhile, the handler has been developed by the applicant for selecting a good product from the bad product according to the result of the test while the manufactured module IC is automatically moved between the processes. In this case it is possible to manufacture a mass product, however, the quality of products is a little deteriorated. That is, the module IC can not be handled from the chamber by the pickup means thereby causing a reliability of product to be deteriorated.

SUMMARY OF THE INVENTION

Accordingly, the present invention has been made to solve the above problems, it is an object to provide a chamber for a module IC handler in which a carrier for loading a plurality of module ICs to be tested is disposed in a chamber so that the module IC is heated at a predetermined temperature.

Another object is to provide a chamber for a module IC handler having a test site in which a module IC is longitudinally disposed to contact with a manipulator so that a replacing operation can be easily executed.

To achieve the above objects, the present invention provides a chamber for a module IC handler comprising: a receiving piece installed at the lower plate of a chamber and formed with a plurality of receiving grooves at the upper surface thereof for being placed a carrier served with a module IC; an operating piece disposed in a predetermined portion of the receiving piece, disposed at the lowest point thereof at the upper surface of the receiving piece and formed at the upper surface thereof with a receiving groove same interval to the receiving groove of the receiving piece for performing up/down movement and advance/retreat movement; operating piece up/down movement means for going up/down the operating piece to be higher the upper surface thereof than the upper surface of the receiving piece; operating piece advance/retreat movement means for advancing/retreating the operating piece by one pitch same to the interval between the receiving grooves; and feeding means for holding the carrier on the feeding path served with the module IC heated at the test condition and for feeding toward the test site.

Furthermore, the present invention provides a chamber of a module IC handler comprising: a sealed chamber for keeping an appropriate temperature; carrier feeding guide means disposed at the lower plate of the chamber for determining the position of the carrier according to the feeding of the carrier into the chamber and disposed at the back plate of the chamber and the upper surface of the carrier feeding control means for guiding the both side of the carrier and for guiding the feeding of the carrier when the carrier is fed toward the socket assembly; pushing means disposed at the front plate for pushing the carrier placed in the carrier feeding guide means toward the socket assembly thereby to be electrically communicated the module IC with the tester; and module IC extracting means disposed at the carrier feeding guide means and at the pushing means for extracting the module IC inserted into the test seven sockets of the socket assembly.

BRIEF DESCRIPTION OF THE DRAWINGS

Other objects and aspects of the invention will become apparent from the following description of embodiments with reference to the accompanying drawings in which:

FIG. 6 is a left side view of FIG. 5a;

FIG. 10 is a sectional view of C—C line in FIG. 7;

DETAILED DESCRIPTION OF PREFERRED EMBODIMENTS

Figure 1:
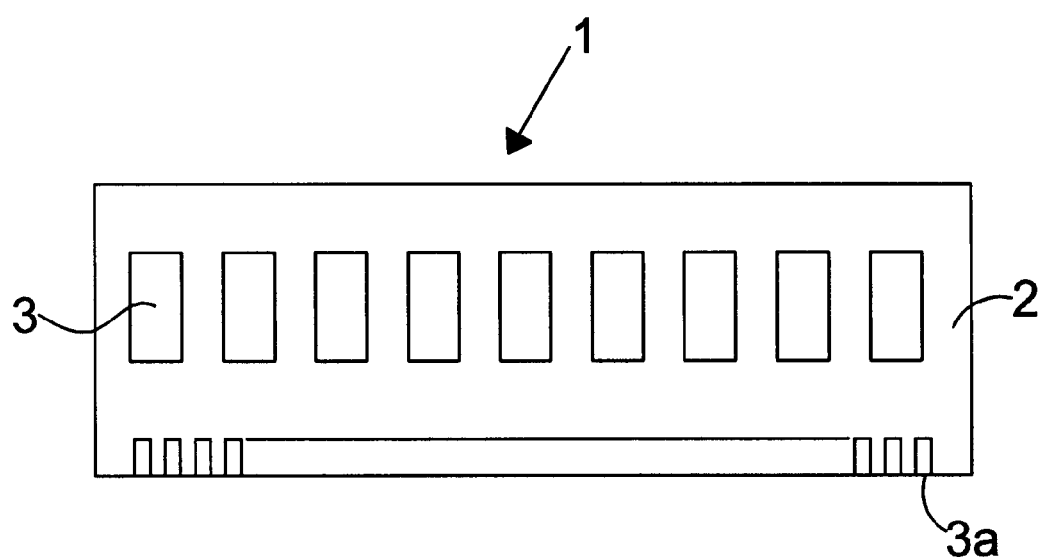
FIG. 1 is a front view of a conventional module IC.
Figure 2:
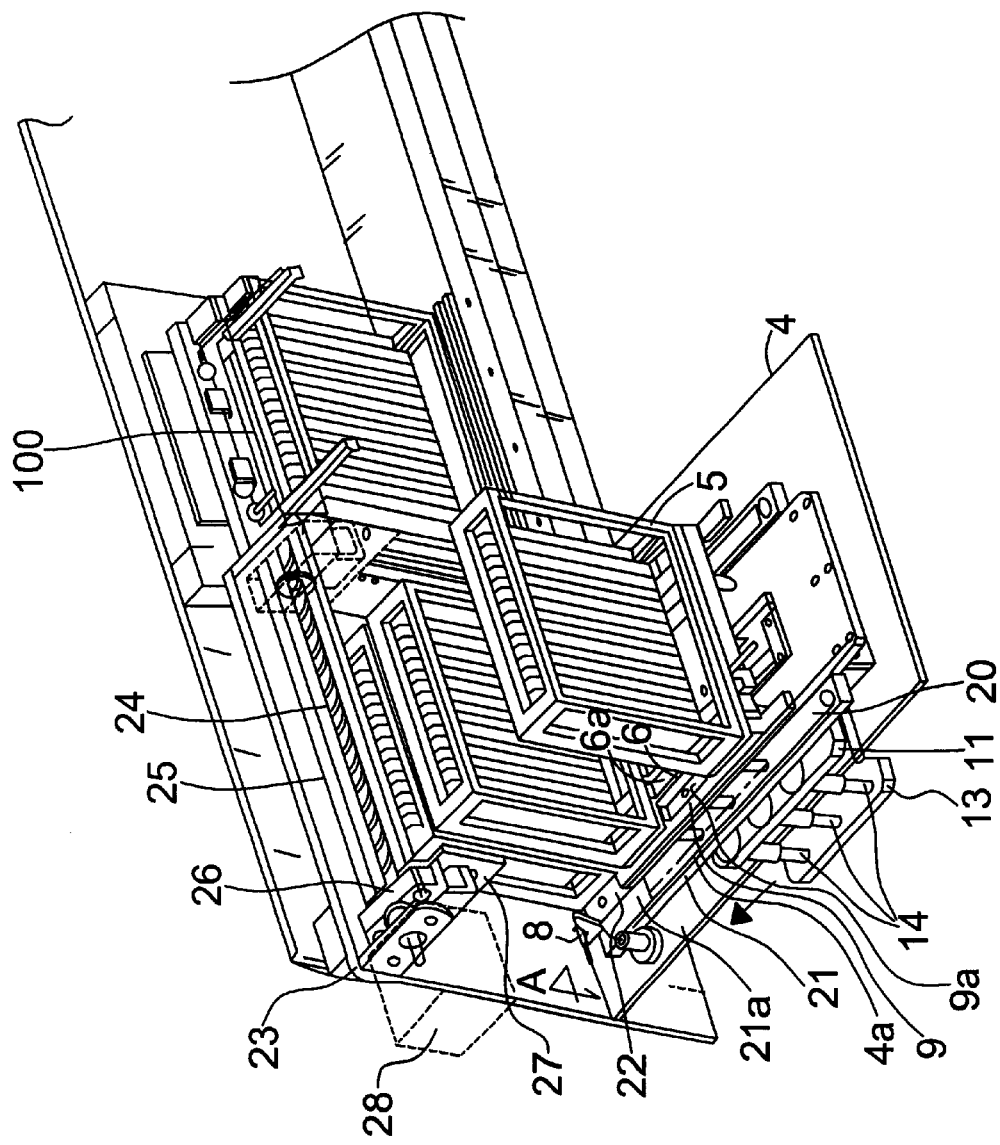
FIG. 2 is a perspective view of a chamber for a module IC handler according to an embodiment of the present invention.

As shown in FIG. 2, a chamber for a module IC handler according to the present invention is, at the lower plate 4 having an inlet and an outlet thereof, disposed with a receiving piece 6 formed with a receiving groove 6a to be placed a carrier 5 thereon.

The carrier 5 to be placed on the receiving groove 6a is served with a plurality of module ICs to be tested. The inlet and outlet are installed with a shutter not shown to open/close when the carrier 5 is inputted/outputted. Furthermore, on the carrier feeding path at the longitudinal and horizontal direction to the inlet and outlet, sensors 7 and 8 are disposed for sensing the feeding state of the carrier 5.

At the side wall closed to the receiving groove 6a to be placed with the carrier 5 through the inlet, a heater not shown is disposed for heating the module IC 1, and a plurality of fans not shown are disposed for blowing a high temperature toward the carrier 5.

Furthermore, at the inside of the receiving piece 6 an operating piece 9 is disposed to perform an up/down movement and an advance/retreat movement. The operating piece 9 is placed at a lower position than the upper surface of the receiving groove 6a when it is in the lowest point and is placed at a higher position than the receiving piece 6 when it is in the highest point. Furthermore, the operating piece 9 is, at the upper surface thereof, formed with a receiving groove 9a. The receiving groove 9a has a same distance to the distance of the receiving groove 6a of the receiving piece 6. This is because the carrier 5 on the receiving piece 6 should be fed toward the feeding path of the test site 100 by one step according to the up/down movement and advance/retreat movement of the operating piece 9. Here, the operating piece 9 may be installed at a region between the receiving piece 6.

The operating piece 9 installed in the chamber for feeding the carrier 5 by one step performs the up/down movement at a region between the highest point and the lowest point by the up/down movement means.

Figure 3:
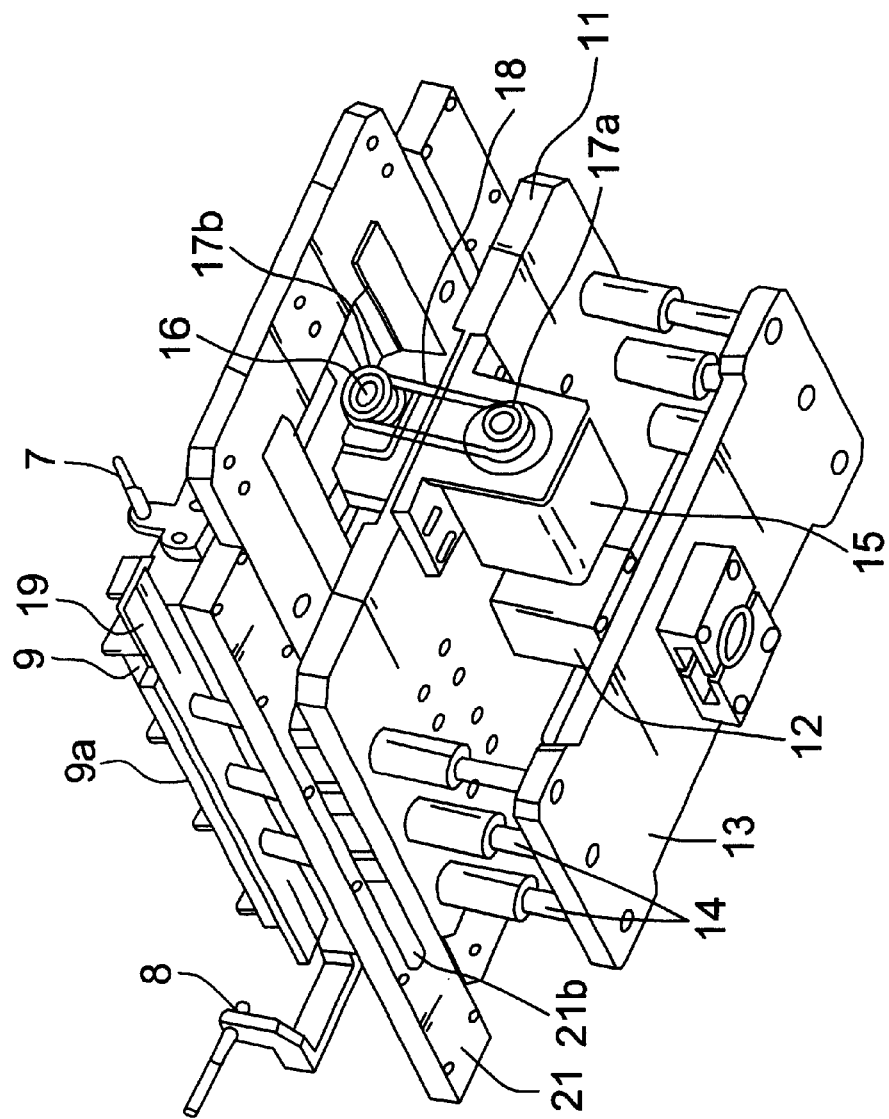
FIG. 3 is a bottom perspective view of FIG. 2.

As shown in FIGS. 2 and 3, the up/down movement means comprises a cylinder 12 secured to the bottom surface of a mounting plate 11, an up/down movement plate 13 secured to the rod of the cylinder 12, and the guide rods 14 secured at a region between the up/down movement plate 13 and the operating piece 9.

The up/down movement means performs the advance/retreat movement by one pitch same to the distance between the receiving groove according to the advance/retreat movement means.

Figure 5A:
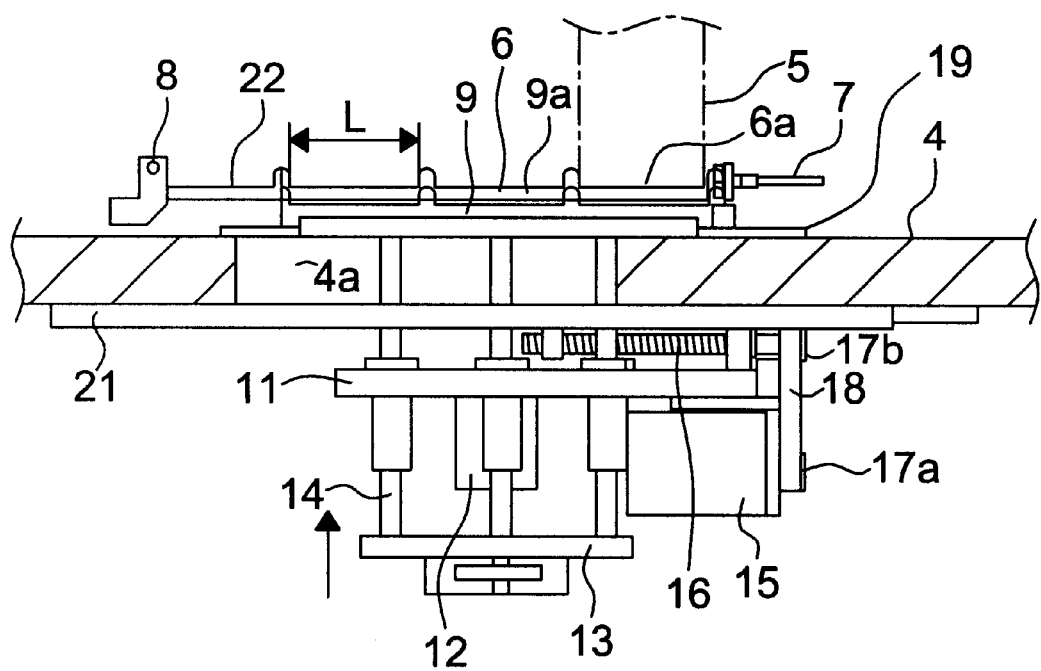
FIG. 5a is a view showing the state that a carrier is received into a first receiving groove of a receiving piece.

As shown in FIGS. 3 and 5a, the operating piece advance/retreat movement means comprises a stepping motor 15 fixed to the mounting plate 11, a ball screw 16 voidly rotationally coupled between the lower plate 4 of the chamber and the mounting plate 11, and a timing belt 18 for transmitting the rotation power from the stepping motor 15 to the ball screw 16. The timing belt 18 is wound to the pulley 17 and 18 secured to the axis of the stepping motor 15 and the ball screw 16. Here, the operating advance/retreat movement means may be constructed with other motor and cylinder.

Because the guide rod 14 secured between the up/down movement plate 13 and the operating piece 9 performs the advance/retreat movement at a predetermined region, the moving region of the guide rod 14 should be sealed at its maximum for keeping constantly the temperature in the chamber. To achieve the sealing state like that, as shown in FIGS. 4, 5a to 5d, the lower plate 4 is formed with a long hole 4a and is, at the upper and lower surfaces thereof, installed with upper and lower shutters 19 and 20 to be performed the advance/retreat movement with the guide rod 14. The upper and lower shutters 19 and 20 are, one side thereof, that is, a right side in FIG. 5a, formed to be longer than the feeding amount L of the guide rod 14. This is because the high temperature in the chamber can be prevented from being emitted through the long hole 4a by closing the long hole 4a by the upper and lower shutter 19 and 20 although the operating piece 9 is advanced in the arrow direction in FIG. 2 for feeding the carrier 5.

Figure 4:
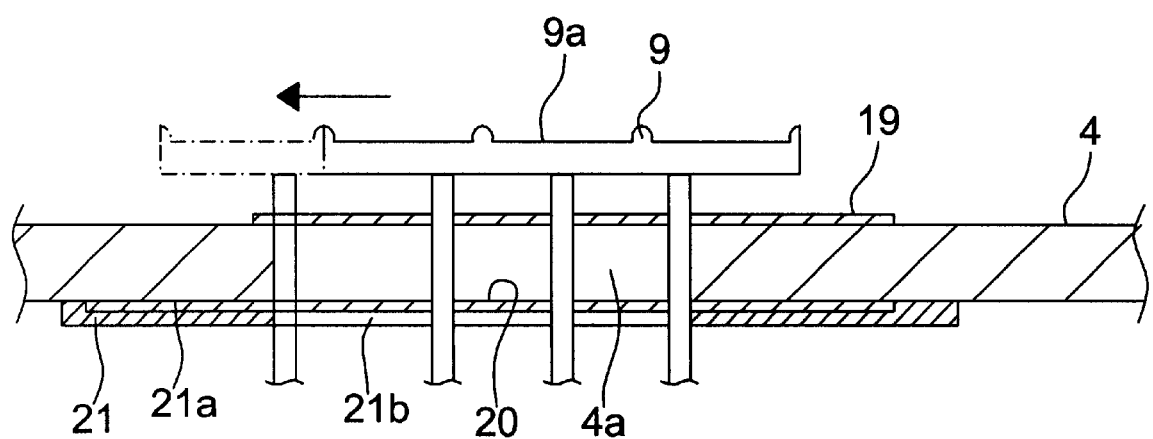
FIG. 4 is a sectional view of A—A line in FIG. 2.
Figure 6:
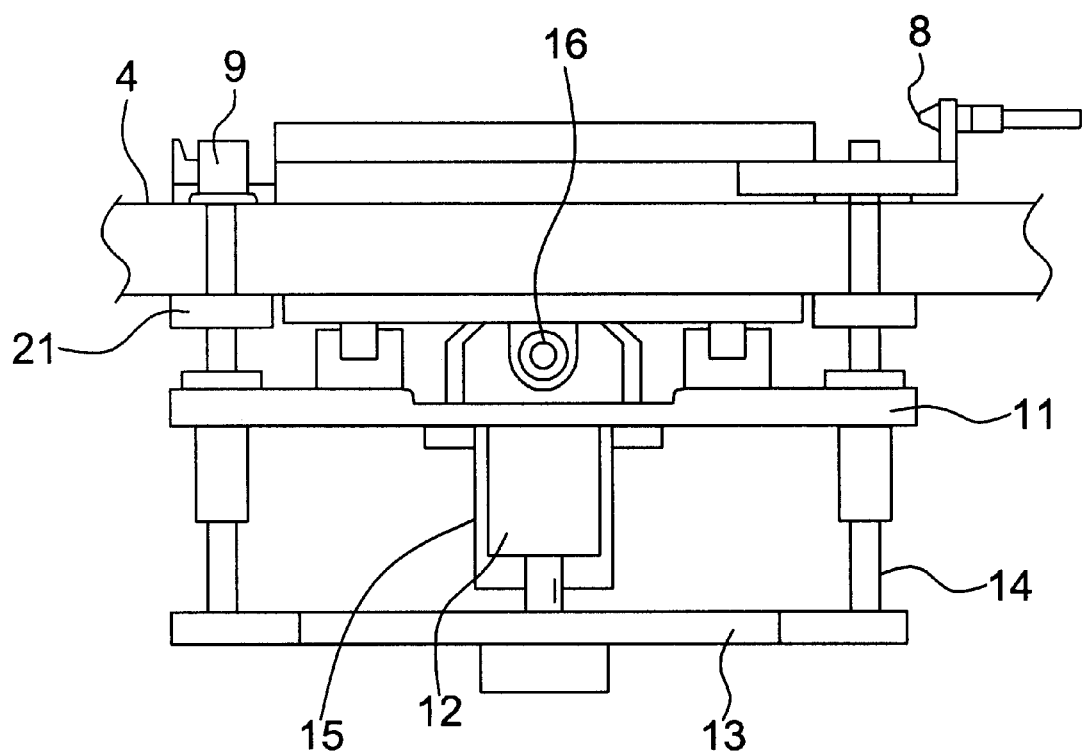
Figure 7:
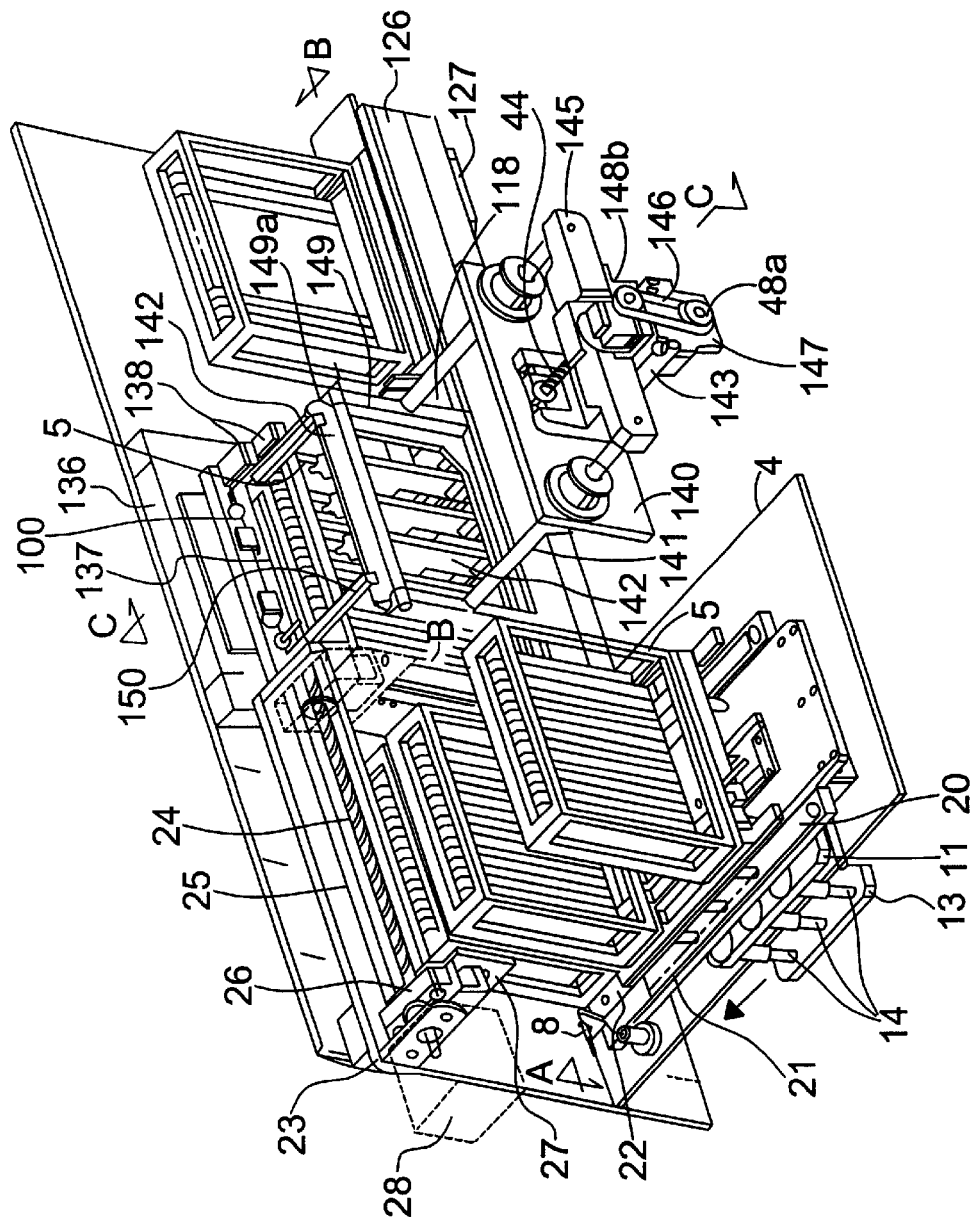
FIG. 7 is a perspective view showing a test site of a chamber for a module IC handler according to another embodiment of the present invention.

As shown in FIGS. 4 and 6, a fixing block 21 is secured to the lower plate 4 for preventing the lower shutter 20 from being deviated and is, at the upper surface thereof, formed with a receiving groove 21a for receiving the lower shutter 20 and formed with a long hole 21b same to the size of the long hole 4a of the lower plate 4.

At this time, the receiving groove 21b should be formed in the advance direction of the guide rod 14 to be longer than the feeding amount L.

As shown in FIG. 2, a feeding means is installed on the upper side of the test site for holding the carrier 5 served with the module IC 1 heated at the appropriated test temperature thereby to be fed toward the test site 100. The carrier 5 is fed by one step.

The feeding means comprises a ball screw 24 voidly rotationally installed between the bracket 23 disposed at the upper side of the carrier 5 on the feeding path 22 of the test site 100, a pair of guide rods 25 secured to both sides of the ball screw 24, a slider 26 coupled to the ball screw 24 by a screw and inserted into the guide rod 25 for coming and going, a push plate 27 secured to the bottom surface of the slider 26 for pushing the carrier 5 toward the test site 100 according to the movement of the slider 26, and a stepping motor 28 secured to one end of the ball screw 24 extracted from the chamber for rotating the ball screw 24.

An operation of the chamber for the module IC handler having the above construction will now be explained.

Firstly, the operation for feeding the carrier into the chamber will be explained.

The carrier 5 is kept in horizontal state at the point for loading the module IC 1. Under the state that a locking member not shown installed in the carrier 5 is rotated, a plurality of module ICs 1 held by the pickup means is, in series, fed to the carrier 5 to be served. After that, the locking member is returned to the initial state. Therefore, the module IC 1 is, the upper surface thereof, pressed by the locking member and the operation for loading the module IC 1 to the carrier 5 is completed.

After the module ICs 1 to be tested are loaded to the carrier 5, the carrier 5 is rotated at an angle of 90 degrees by the rotator thereby to be placed on the first receiving groove 6a of the receiving piece 6 through the inlet of the chamber, as shown in FIG. 5a.

Under this state, when the sensor 7 senses that the carrier 5 has been placed on the first receiving groove 6a, the module IC 1 served in the carrier 5 is heated under the test condition because the high temperature is transmitted by the heater and the fan during the predetermined time.

While the module IC 1 on the first receiving groove 6a is heated, the rotator is returned to the initial state for holding a new carrier. At this time, the carrier 5 on the receiving piece 6 is fed by one step according to the up/down movement and the advance/retreat movement of the operating piece 9.

FIG. 5a is a view showing the state that the carrier is placed on the first receiving groove of the receiving piece.

Figure 5B:
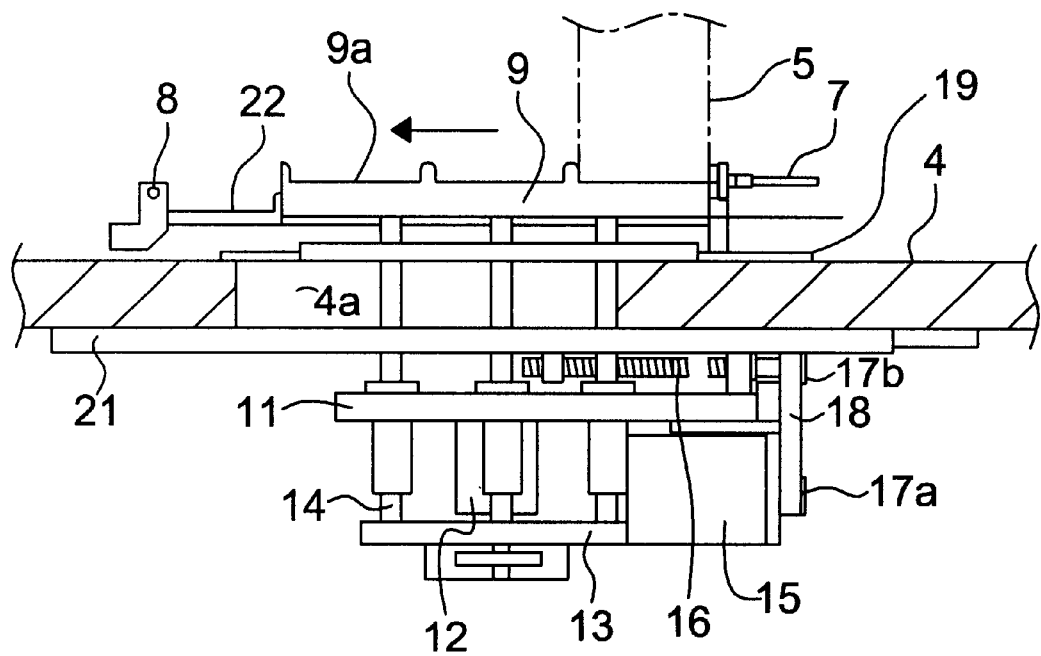
FIG. 5b is a view showing a separated state of a carrier from the receiving piece by rising an operating piece to a highest point.

Under this state, when the cylinder 12 operates to pull the rod, the carrier 5 is separated from the receiving groove 6a because a pair of the operating pieces 9 connected to the up/down movement plate 13 by the guide rod 14 rises to the highest point. That is, because the carrier 5 on the receiving groove 6a rises to the highest point at the state of being placed on the receiving groove 9a of the operating piece 9, the carrier 5 is separated from the receiving piece 6 as shown in FIG. 5b. The above operation is possible because the guide rod 14 is inserted into the upper and lower shutters 19 and 20 to accomplish the up/down movement.

After the carrier 5 is separated from the receiving piece 6 by the operating piece 9, the operating piece 9 is fed by one step as shown in FIG. 5b according to the driving of the stepping motor 15. That is, when the rotation power generated by the stepping motor 15 is transmitted to the ball screw 16 through the timing belt 18 to be rotated, the cylinder 12 and the advance/retreat movement means are simultaneously fed in the arrow direction as shown in FIG. 5b because the ball screw 16 is coupled to the mounting plate 11 by the screw.

Figure 5C:
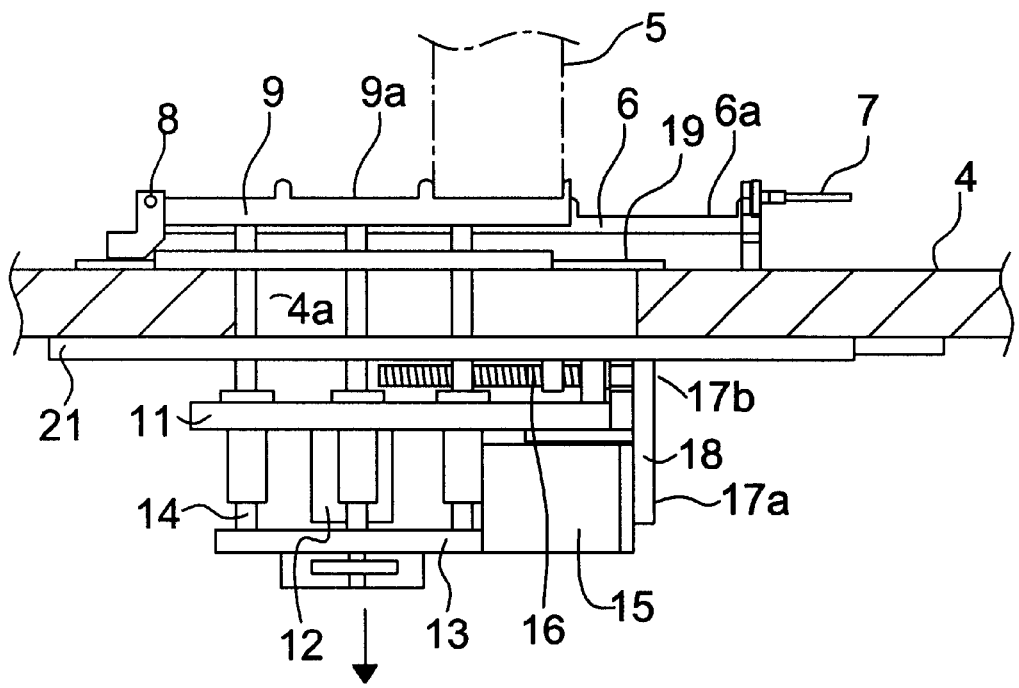
FIG. 5c is a view showing a one step fed state of the operating piece.

Therefore, the guide rod 14 inserted into the mounting plate 11 is fed as shown in FIG. 4 according to the feeding of the mounting plate 11. At this time, because the upper and lower shutters 19 and 20 disposed at the upper surface and the lower surface of the lower plate 4 are moved with the guide rod 14, the long hole 4a formed in the lower plate 4 is sealed by the upper and lower shutters 19 and 20 while the up/down movement plate 13, guide rods 14, and operating piece 9 are in motion. Therefore, the module IC carrier 5 is positioned above the second receiving groove 6a of the receiving piece 6 as shown in FIG. 5c.

Figure 5D:
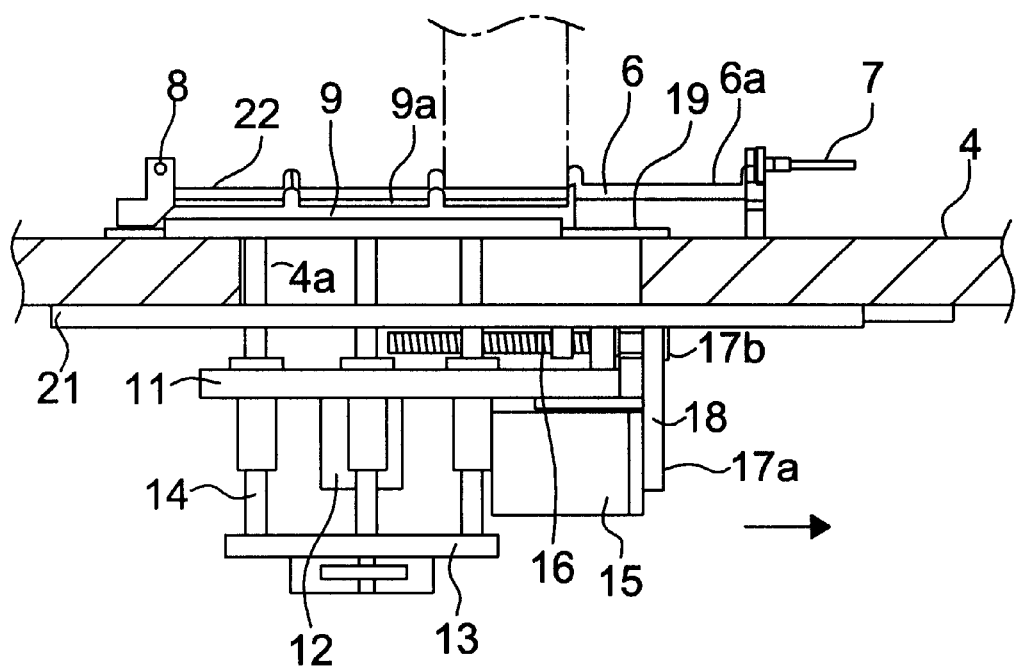
FIG. 5d is a view showing the state that one step fed carrier is received into the receiving piece by dropping the operating piece to the lowest point.

Furthermore, when the cylinder 12 is re-operated, the operating piece 9 goes down to the lowest point so that the carrier 5 can be placed on the second receiving groove 6a of the receiving piece 6, as shown in FIG. 5d. Therefore, the carrier 5 is completed its one step operation.

After the carrier 5 is fed by one step, the operating piece 9 is returned to the initial state as shown in FIG. 5a by the driving of the stepping motor 15. It is possible for the operating piece 9 to be returned to the initial state because the lowest point of the operating piece 9 is lower than the upper surface of the receiving groove 6a.

Next, a new carrier is supplied through the inlet according to the driving of the rotator so that it is placed on the first receiving groove 6a formed in the receiving piece 6. Therefore, because the foregoing operation is performed, two carriers are simultaneously fed toward the test site 100 by one step.

After the carrier 5 supplied in advance is fed toward the feeding path 22 of the test site 100, the push plate 27 secured to the slider is in the back side (left in the drawing) of the carrier 5 because the slider 26 is in the solid line of FIG. 2 for feeding the carrier toward the test site. That is, under the state that the carrier 5 is on the feeding path of the test site 100, the module IC 1 served in the carrier 5 is kept in the state of being heated to comply with the test condition.

After the carrier 5 is fed toward the feeding path of the test site 100, the sensor 8 senses the state and the shutter not shown of the outlet is opened, and, at the same time, the ball screw 24 is rotated according to the driving of the stepping motor 28 so that the slider 26 coupled to the ball screw 24 by the screw is fed toward the test site 100 along the guide rod 25.

Driven by the movement of the slider 26, the carrier 5 is fed toward the test site 100. When the slider 26 is returned to the start position, the push plate 27 is clear of the next carrier 5 on the receiving piece 6 to avoid interfering therewith.

The foregoing description is for feeding one carrier 5 supplied into the chamber by one step and for heating to be complied with the test temperature and feeding it toward the test site 100. Therefore, as long as the carrier 5 is continuously supplied into the chamber, the same operation will be continuously performed.

Another embodiment of the present invention will now be explained with reference to FIGS. 7 to 11.

As shown in FIGS. 7 to 11, the chamber for the module IC handler of another preferred embodiment of the present invention comprises a carrier feeding control means provided at the lower plate 115 of the chamber 114. The chamber 114, which is kept an appropriate temperature to be complied with the test, includes a carrier feeling device for feeding the carrier 5 served with the module ICs 1 to be tested to the outside of the chamber 114. The carrier feeding device includes a carrier feeding guide means for guiding the feeding of the carrier 5 while the carrier 5 is advanced or retreated toward the socket assembly 117 to be tested, and a pushing means for pushing the carrier 5 toward the socket assembly 117 during test. The carrier feeding device also includes an extracting means for extracting the module IC 1 served in the carrier 5 from the socket assembly 117 after test.

Figure 8:
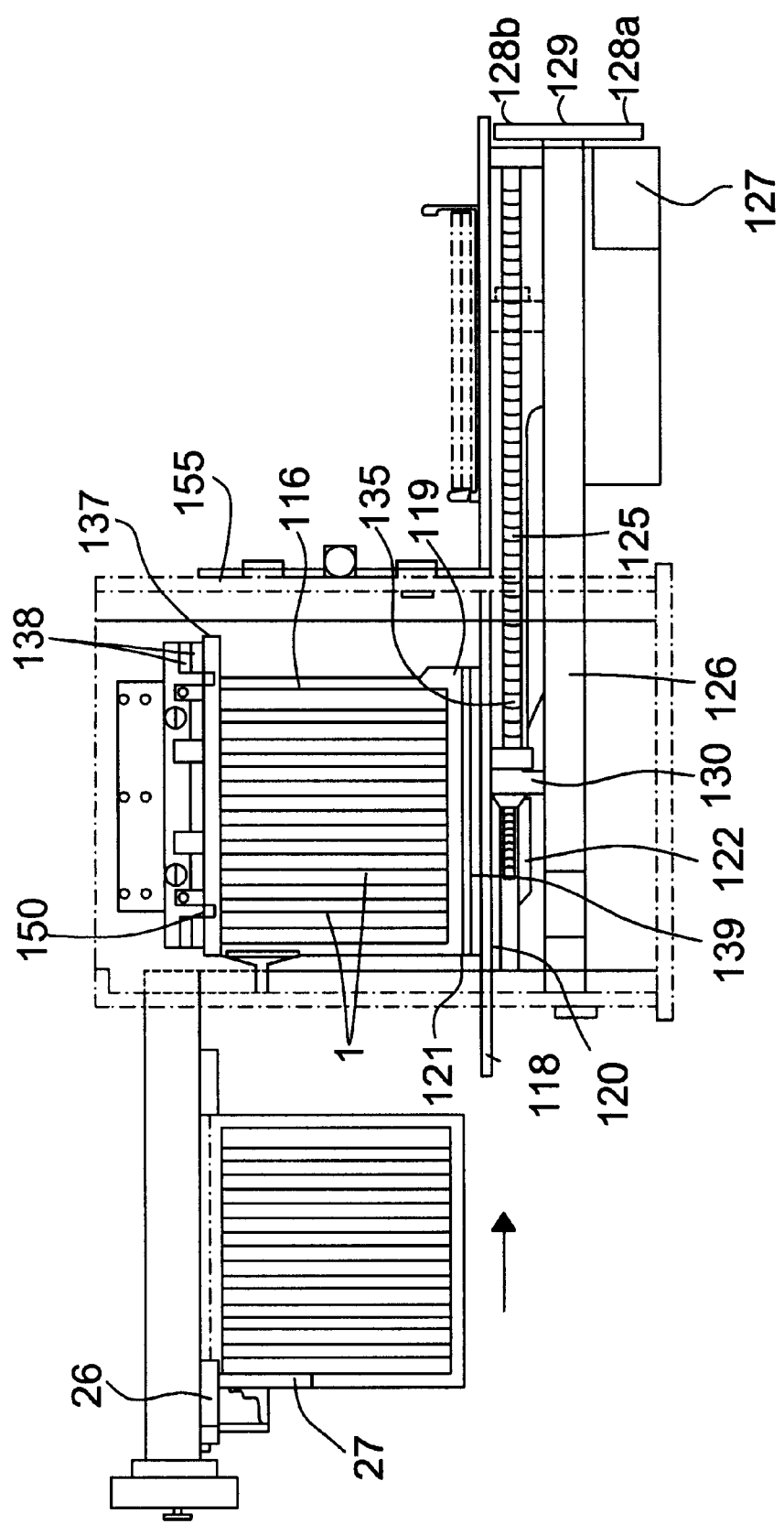
FIG. 8 is a sectional view of B—B line in FIG. 7.
Figure 9:
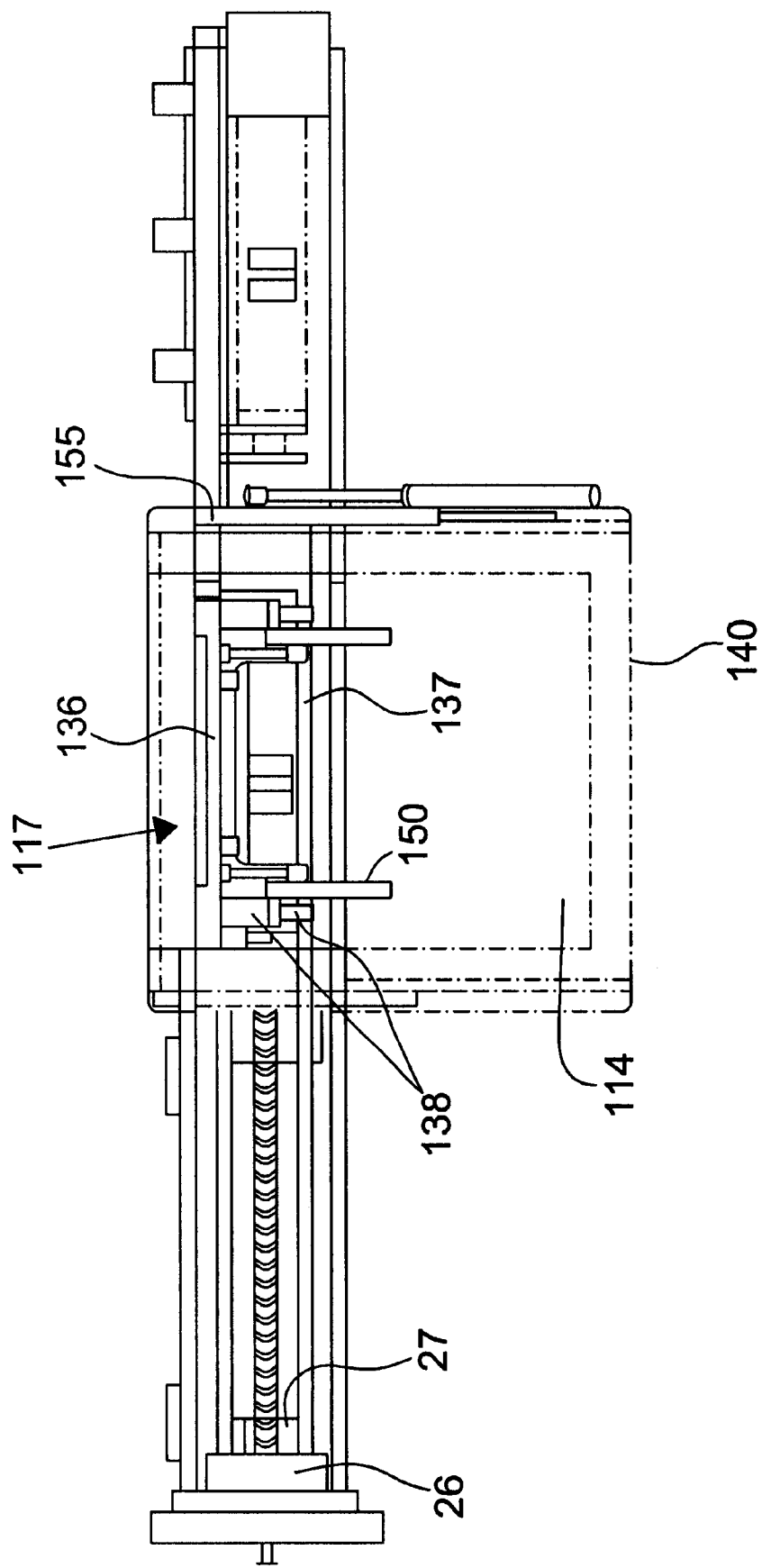
FIG. 9 is a plane view of FIG. 8.
Figure 11:
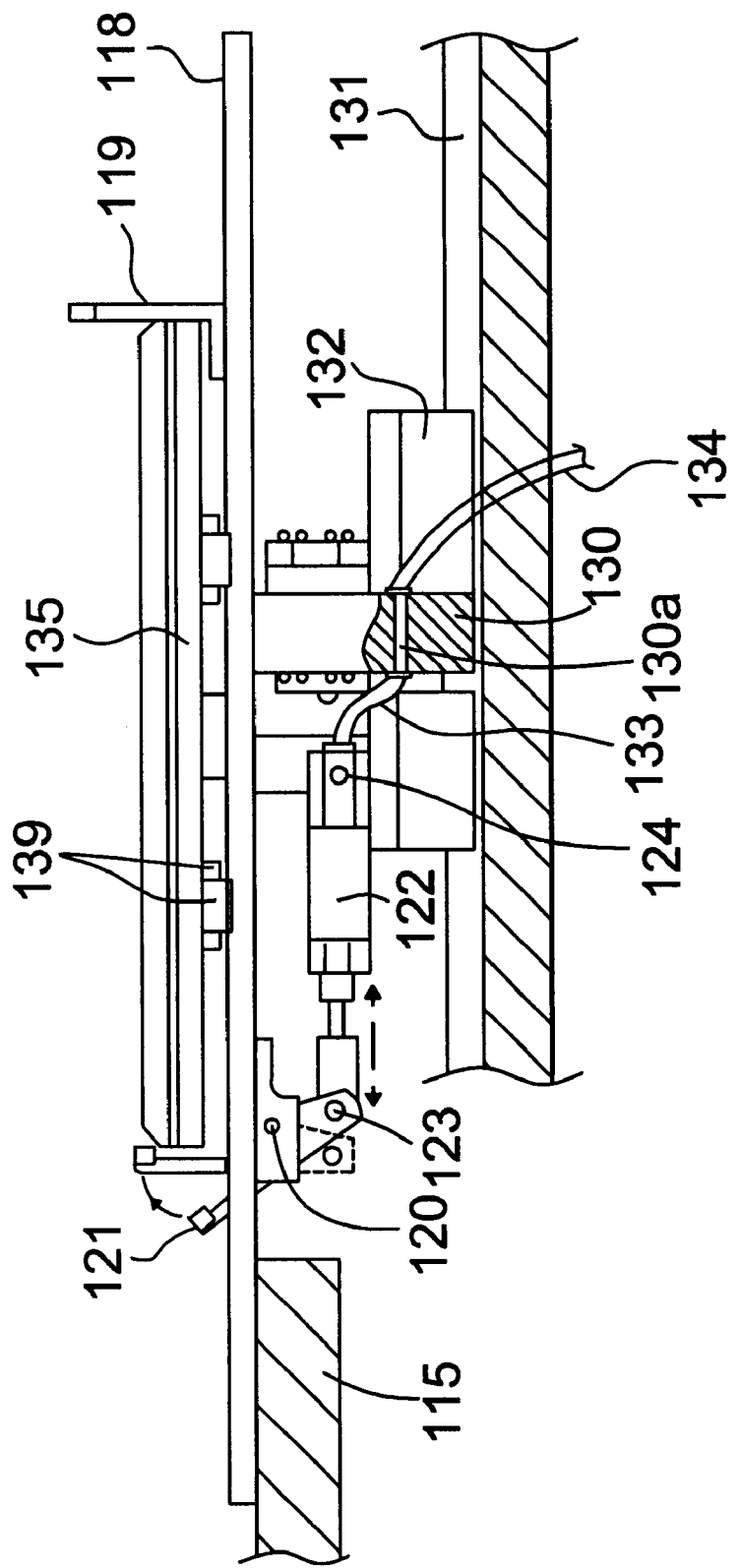
FIG. 11 is a front view showing a carrier feeding control means.

As shown in FIGS. 8, 9 and 11, the carrier feeding control means includes a feeding plate 118 movably installed at the lower plate 115 of the chamber 114 configured to move in the same direction to the feeding direction of the carrier 5. The carrier feeding control means also includes a fixing stopper 119 installed on the feeding plate 118 for controlling the feeding of the carrier 5 into the chamber 114, and an operating stopper 121 rotationally installed on the basis of the axis 120 at the inlet of the carrier 5 for supporting the side of the carrier 5. The carrier feeding control means further includes a cylinder 122 installed at the bottom surface of the feeding plate 118 for rotating the stopper 121 on the basis of the feeding of the carrier 5 into the chamber 114, and a driving unit installed at the bottom surface of the feeding plate 118 for feeding in horizontal the feeding plate 118.

As shown in FIG. 8, the feeding plate 118 for feeding the carrier 5 to the outside of the chamber is preferably sized to prevent its end from being deviated from the chamber 114 although the carrier 5 is extracted from the chamber in its maximum. This is for preventing heat in the chamber from being emitted to the outside through the feeding path of the feeding plate is generated by the extraction of the feeding plate 118 from the chamber.

As shown in FIG. 11, the carrier 5 is fed into the chamber 114, a pin 123 pivots executing a circle on the basis of the axis 120. A stopper 121 pivots due to the driving of the cylinder 122 because the rod of the cylinder 122 is coupled to the stopper 121 by a pin 123. The stopper 121 is for supporting the side of the carrier 5 and the driving the stopper 121 due to the stopper 121 rotating on the basis of the axis 120. Furthermore, the other end of the cylinder 122 is pivotably coupled to the pin 124 so that the stopper 121 can be rotated on pin 123 and pin 120.

As shown in FIG. 8, the driving unit for feeding the plate 118 is constructed so that the lower plate of the chamber 114 is rotationally disposed with the ball screw 125. The ball screw 125 is coupled to the motor 127 for rotating the ball screw 125. Between the pulleys 128a and 128b secured to the ball screw 125 and the axis of the motor 127 respectively, the timing belt 129 transmits power from the motor 127 to the ball screw 125.

Because the ball screw 125 rotating according to the driving of the motor 127 is coupled to the slider 130 which is secured to the bottom surface of the feeding plate 118, the feeding plate 118 is moved horizontally by the ball screw 125 when the ball screw 125 is rotated according to the driving of the motor 127.

Because the driving unit is, as shown in FIG. 8, covered with a U-shaped closing plate 126 disposed to be extended to the outside of the chamber 114, the chamber 114 is separated its inside and outside each other by the slider. This is for preventing heat in the chamber from being emitted to the outside while the feeding plate 118 is extracted to the outside for feeding the carrier S to the outside of the chamber 114 after test.

As shown in FIG. 11, a guide block 132 is secured to the both sides of the slider 130 which threadably engages the ball screw 125. The guide block 132 is inserted to the LM guide 131 and is made to be the same length. This is for distributing uniformly the resistance generated when the feeding plate 118 is horizontally moved by the guide block 132 and the LM guide 131, as driven by the rotation of the ball screw 125 thereby to stabilize the operation of the feeding plate 118.

The slider 130 is constructed so that a hole 130*a* is formed therethrough and a heat-resistant tube 133 is connected between the cylinder 122 and the hole 130*a*. A general purpose tube 134 is connected to the hole on the outside of the chamber 114. The heat resistant tube 133 is used because the temperature in the chamber 114 is high. The tube 133 and 134 supply compressed air to the cylinder 122 in order to drive the cylinder 122.

The heat-resistant tube 133 has a high heat-resistant property, however, it has a very weak point about a bend. Therefore, because the horizontal movement of the feeding plate 118 causes bends and subsequent breaks when the entire supplying line is applied as the heat-resistant tube, the heat-resistant tube 133 should be connected between the cylinder 122 and the hole 130*a*. Furthermore, the general tube 134 should be connected to the hole 130*a* at the outside of the chamber 114. Therefore, when the feeding plate 118 is moved, breakage due to bending can be prevented.

The carrier feeding guide means for feeding the carrier 5 comprises a lower guide 135 installed at the feeding plate 118 to be advanced and retreated relative to the socket assembly 117. The carrier feeding guide means also includes an upper guide 137 installed at the back plate to be advance and retreated relative to the socket assembly 117. An LM guide 138 and 139 for guiding the feeding of the upper and lower guides is also included in the carrier feeding guide means.

The pushing means for pushing the carrier 5 toward the socket assembly 117 during a test comprises a pair of guide rods 141 movably coupled to the front plate 140. The pushing means also includes a pusher 142 installed at the front end of the guide rod 141 for pushing the carrier 5 toward the socket assembly 117 as the guide rod 141 is advanced. A supporting block 145 secured to one end of the guide rod 141 disposed at the outside of the chamber 114 and rotationally installed at the bracket 143 and inserted to the ball screw 144 is also included in the pushing means. The pushing means further includes a motor 147 installed at the bracket 143 for rotating the ball screw 144 through the timing belt 146.

The rotation power generated by the motor 147 can be transmitted to the ball screw 144 through the timing belt 146. The timing belt 146 couples the pulleys 148*a* and 148*b*, and pulley 148*b* is secured to one end of the ball screw 144.

At the front end of the guide rod 141, which is to be advanced and retreated according to the rotation of the ball screw 144 by the motor 147, a support frame 149 having a guide rail 149*s* is secured. The guide rail 149*a* formed at the supporting frame 149 is detachably mounted with the pusher 142 for pushing the carrier S toward the socket assembly 117. This is for enabling rapid replacement of the pusher 142 when pushing distance is changed due to different sized module ICs served in the carrier 5.

The pusher 142 mounted at the guide rail 149*a* of the supporting frame 149 serves to prevent the deviation from the supporting frame 149 by the other supporting means, such as, a bolt not shown during its operation.

The extracting means for extracting the module IC 1 provided in the carrier 5 from the socket assembly 117 after the test is completed comprises an upper locking lever 150 secured to the both sides of the upper guide 137 for pulling the upper side of the carrier 5. Extraction is done by locking to the upper side of the pusher 142 toward the opposition direction of the socket assembly 117 when the pushing means is returned. Additionally, a lower locking lever 151 is provided secured to the lower center portion of the supporting frame 149 for pulling the lower portion of the carrier S toward the opposition direction of the socket assembly 117 when the pushing means is returned.

The operation of the test site of the chamber for the module IC handler having the above construction will now be explained.

As shown in FIG. 8, if the carrier served with the module IC 1 is not placed in the chamber 114, but in the heating chamber, the stopper 121 remains rotated counter-clockwise in order to be placed below the upper surface of the lower guide 135. In this configuration, when the push plate 152 pushes the fixing slider 153 to the right as shown in the figure according as the inlet shutter (not shown) is opened and the ball screw 125 is rotated by the driving of the motor 127, the carrier 5 is fed toward the chamber 114. At this time, the carrier 5 is guided toward the chamber 114 by the upper and lower guide 135 and 137.

After the carrier 5 is fed toward the chamber 114 and its front end is locked in place by the stopper 119, the slider 153 is returned to the initial state, and, at the same time, the chamber 114 is closed by the inlet shutter. After the carrier 5 having the module IC 1 to be tested is fed toward the chamber 114, compressed air is supplied to the cylinder 122 through the general tube 134, the hole 130*a* in the slider 130, and through heat-resistant tube 133 to activate the cylinder 22 and drive the push rod disposed at the lower portion of the feeding plate 118.

When the stopper 121 is rotated in the clockwise direction by advancing the cylinder rod to close the side wall of the carrier 5, the carrier 5 is inserted into the upper and lower guide 135 and 137 to prevent the movement thereof.

Figure 10A:
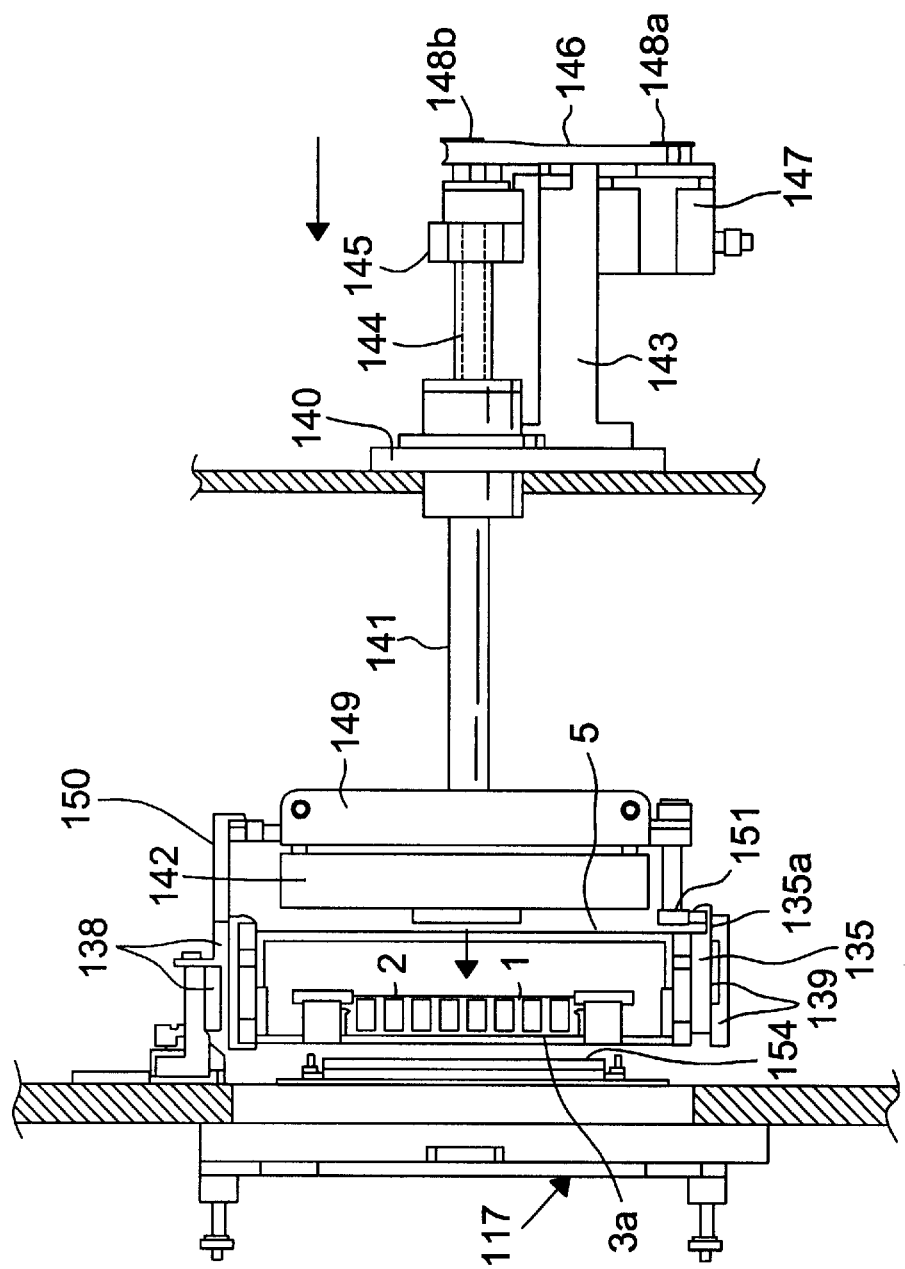
FIG. 10a is a view showing an initial state that a carrier served with a module IC is fed to a test site.

After that, as shown in FIG. 10*a*, when the motor 147 transmits its rotation power to the ball screw 144 through the timing belt, the supporting block 145 inserted into the ball screw 144 is advanced to the left as shown in the drawing. Therefore, the supporting frame 149 secured to the supporting block 145 by the guide rod 141 is advanced with the supporting block 145 so that the pusher 142 mounted at the guide rail 149*a* of the supporting frame 149 pushes the module IC 1 served in the carrier 5 toward the socket assembly 117.

Figure 10B:
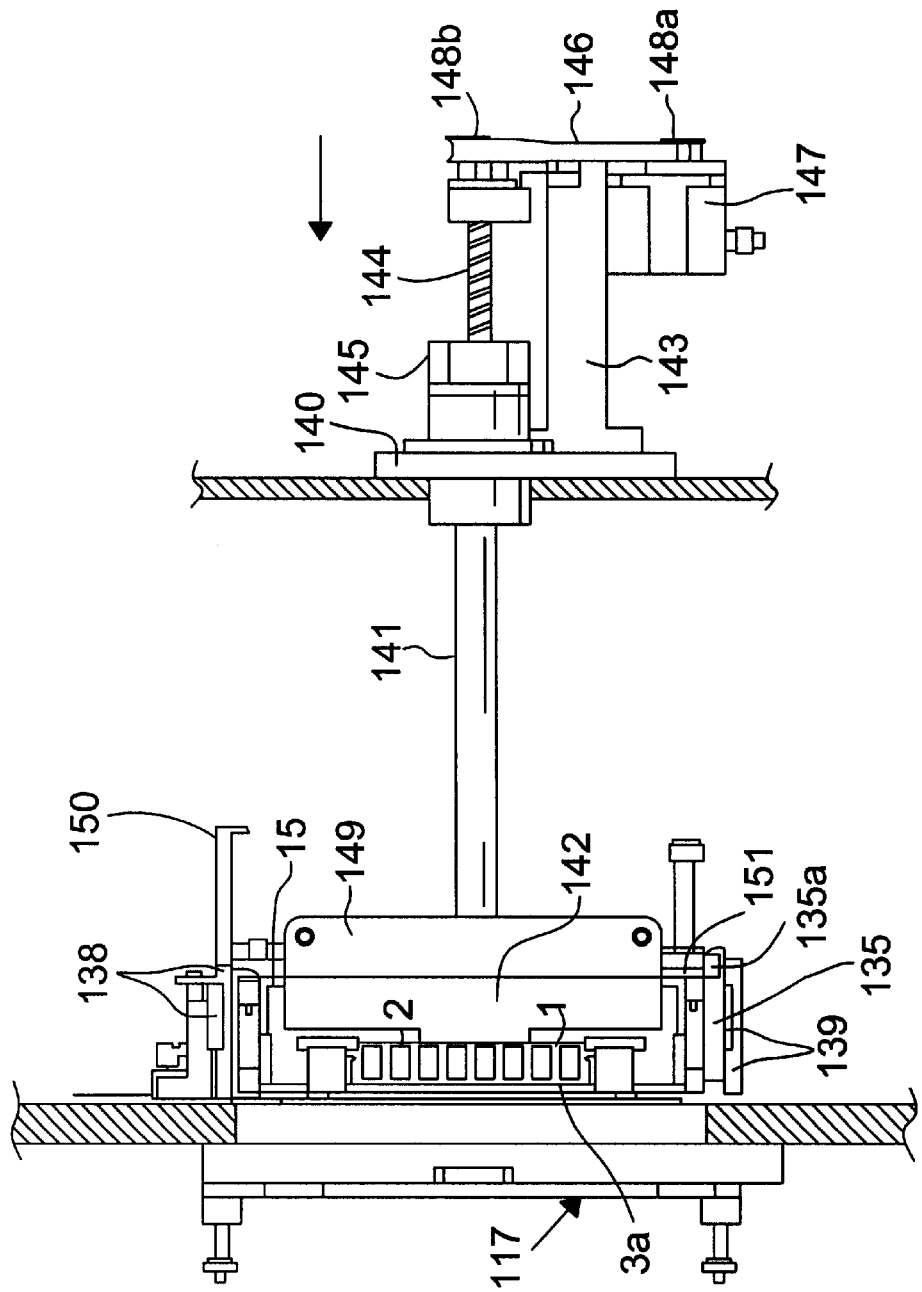
FIG. 10b is a view showing the state in that a carrier is fed to a test socket by a pusher.

Inserting the module IC 1 into the socket assembly 117, as shown in FIGS. 10*a* and 10*b*, turns on an electric current with the tester (not shown) connected to the test socket 154 so that the test for the module IC 1 is performed during a predetermined time.

As previously described, when the carrier 5 is advanced toward the socket assembly 117 by the advancing of the pusher 142, the carrier 5 is guided by the LM guide 138 and 139 disposed at the upper and lower guide 135 and 137.

After the predetermined testing time, the pushing means is returned to the initial state by the motor 147. When the pushing means is returned to the initial state, the module IC 1 connected to the test socket 154 is separated from the socket assembly 117 by the extracting means.

When the pusher 142 is moved to the right side, as shown in the drawing, it is returned to the initial state, and the carrier 5 is retreated with the pusher 142 because the upper and lower guide 135 and 137 are pulled together by the lower locking lever 151 secured to the supporting frame 149. The carrier 5 is then inserted into the groove 135a of the lower guide 135 and the upper locking lever 150 connected to the backward surface of the pusher 142. Thus, the module IC 1 is extracted from the test socket 154.

If the carrier 5 is served with 16 module ICs 1 and the socket assembly 117 is mounted with four test sockets 154, testing for the first, fifth, ninth and thirteenth module IC 1 is performed when the carrier 5 is performed in its first advance/retreat movement by the pushing means and the extracting means.

After the feeding plate 118 is fed by one step, where one step is the distance between the module ICs held in the carrier, to the right, as shown in the drawing, the test for the second, sixth, tenth and fourteenth module IC 1 is performed when the carrier 5 cycles through its second advance/retreat movement, and the test for the third, seventh, eleventh and fifteenth module IC 1 is performed when the carrier 5 is cycled through its third advance/retreat movement, and the test for the fourth, eighth, twelfth and sixteenth module IC 1 is performed when the carrier 5 is cycled through its last advance/retreat movement.

The distance for feeding the feeding plate 118 is determined on the basis of the number of the module ICs held in the carrier 5 and the number of the test sockets 154 mounted in the socket assembly 117.

After the test for all module ICs are completed, the carrier 5 is removed from the chamber 114.

For this operation when the ball screw 125 is rotated by the driving of the motor 127, the feeding plate 118 is moved to the right side in the drawing to be extracted from the chamber 114 thereby to be positioned as shown in FIG. 8 because the ball screw 125 is inserted with the slider 130 secured to the bottom surface of the feeding plate 118. It is to be understood that the inlet shutter 155 is opened before the above operation.

Because the portion of the feeding plate 118 is positioned in the chamber 114, the high temperature in the chamber 114 is not emitted to the outside through the feeding path of the feeding plate 118 although the carrier 5 is entirely removed from the chamber 114 by the driving of the motor 127.

Meanwhile, when the feeding plate 118 is extracted from the chamber 114, the heat in the chamber 114 is not lost to the outside through the lower portion of the feeding plate 118 because the slide 130 is moved inside, thereby closing the plate 126.

After the carrier 5 is extracted from the chamber 114, the cylinder 122 is reactuated so that the stopper 121 supporting the side of the carrier 5 is rotated, and the carrier 5 is extracted from the lower guide 135 by the other rotator thereby to be distributed the module IC according to the test result.

After the carrier 5 is extracted from the lower guide 135 by the rotator, the feeding plate 118 is fed to the inside of the chamber 114 by the driving portion. Therefore, because the inlet shutter is opened but outlet shutter is closed, the module IC held in a new carrier is supplied to the chamber thereby to perform the test for module IC.

Having described specific preferred embodiment of the invention with reference to the accompanying drawings, it is to be understood that various changes and modifications may be effected therein by one skilled in the art without departing from the scope or spirit of the invention as defined in the appended claims.

What is claimed:

1. An integrated circuit (IC) carrier handler, comprising:
   a lower plate;
   at least one receiving piece attached to the lower plate, wherein each receiving piece comprises a plurality of grooves, and wherein each groove is configured to receive an IC carrier;
   a mounting plate coupled to the lower plate;
   an up/down movement plate that is moveably attached to the mounting plate;
   at least one operating piece, wherein each operating piece is attached to the up/down movement plate by at least one guide rod, wherein each at least one guide rod passes through an elongated hole in said lower plate, wherein each operating piece comprises a plurality of grooves, wherein each groove is configured to receive an IC carrier, and wherein the at least one operating piece is configured to vertically move IC carriers off the at least one receiving piece, to horizontally move the IC carriers relative to the at least one receiving piece, and to vertically move the IC carriers back into engagement with the at least one receiving piece; and
   a shutter configured to seal the elongated hole around each at least one guide rod passing therethrough.

2. The IC carrier handler of claim 1, further comprising a vertical driver configured to move the up/down movement plate and the at least one operating piece vertically with respect to the mounting plate.

3. The IC carrier handler of claim 2, wherein when the at least one operating piece is moved to its highest point, it is located above said at least one receiving piece, and when the at least one operating piece is moved to its lowest point, it is located below the at least one receiving piece.

4. The IC carrier of claim 2, wherein said driver comprises a piston and cylinder.

5. The IC carrier of claim 1, further comprising a horizontal driver configured to move the mounting plate and the at least one operating piece horizontally with respect to the lower plate.

6. The IC carrier of claim 5, wherein said driver comprises a stepper motor and ball screw attached to one of the mounting plate and the lower plate, and a threaded block attached to the other of the mounting plate and lower plate, wherein the threaded block is coupled to the ball screw.

7. The IC carrier handler of claim 5, further comprising a vertical driver configured to move the up/down movement plate and the at least one operating piece vertically with respect to the mounting plate.

8. The IC carrier handler of claim 1, wherein the at least one guide rod passes through the mounting plate and the lower plate, and wherein the at least one operating piece is mounted on top of said at least one guide rod.

9. The IC carrier handler of claim 1, further comprising an operating piece driver configured to move the at least one operating piece in vertical and horizontal directions relative to the at least one receiving piece.

10. The IC carrier handler of claim 1, wherein said shutter comprises:
   an upper shutter configured to seal an upper side of the elongated hole around each at least one guide rod passing therethrough; and
   a lower shutter configured to seal a lower side of the elongated hole around each at least one guide rod passing therethrough.

11. The IC carrier handler of claim 1, further comprising a position sensor configured to detect when an IC carrier is placed on a first groove of the at least one receiving piece.

12. The IC carrier handler of claim 1, further comprising a position sensor configured to detect when an IC carrier is placed on a last groove of the at least one receiving piece.

13. The IC carrier handler of claim 1, further comprising a feeding device configured to transfer an IC carrier from a position on a last groove of the at least one receiving piece to a test position in the handler.

14. The IC carrier handler of claim 13, wherein the feeding device comprises:
   a stepper motor with a ball screw connected to a rotating shaft of the stepper motor; and
   a pusher member threadably engaged on the ball screw such that rotation of the ball screw will cause linear movement of the pusher member, and wherein the pusher member is configured to push the IC carrier from the position on a last groove of the at least one receiving piece to the test position in the handler.

15. An integrated circuit (IC) carrier handler, comprising:
   at least one receiving piece configured to support a plurality of IC carriers, wherein each at least one receiving piece includes a plurality of grooves for receiving IC carriers;
   a transferring device configured to move an IC carrier from a first groove on the at least one receiving piece to a second groove on the at least one receiving piece; and
   a shutter configured to sealably and moveably engage said transferring device.

16. The IC carrier handler of claim 16, wherein the transferring device comprises at least one operating piece configured to raise an IC carrier out of the first groove on the at least one receiving piece, to move the IC carrier to a position above the second groove on the at least one receiving piece, and to lower the IC carrier into the second groove on the at least one receiving piece.

17. The IC carrier handler of claim 16, wherein the transferring device further comprises:
   a vertical driver configured to move the at least one operating piece in the vertical direction; and
   a horizontal driver configured to move the at least one operating piece in the horizontal direction.

18. The IC carrier handler of claim 17, wherein the vertical driver comprises a piston and cylinder connected between the at least one receiving piece and the at least one operating piece and configured to move the at least one operating piece vertically with respect to the at least one receiving piece.

19. The IC carrier handler of claim 17, wherein the horizontal driver comprises:
   a stepper motor with a ball screw attached to a rotating shaft of the stepper motor; and
   a threaded fixture threaded onto the ball screw, wherein the stepper motor and fixture are attached between the at least one receiving piece and the at least one operating piece such that rotation of the shaft of the stepper motor will cause the at least one operating piece to move in a horizontal direction with respect to the at least one receiving piece.

20. The IC carrier handler of claim 15, further comprising a feeding device configured to transfer an IC carrier from a position on a last groove of the at least one receiving piece to a test position in the handler.

21. The IC carrier handler of claim 15, wherein said shutter comprises an upper shutter and a lower shutter.

* * * * *